United States Patent [19]

Kobayashi et al.

[11] Patent Number: 4,830,888
[45] Date of Patent: May 16, 1989

[54] SURFACE TREATMENT METHOD AND APPARATUS THEREOF

[75] Inventors: Atsuo Kobayashi, Hikone; Takuma Yamada, Moriyama; Kiyoshi Akao, Hikone, all of Japan

[73] Assignee: Dainippon Screen Mfg. Co., Ltd., Kyoto, Japan

[21] Appl. No.: 906,404

[22] Filed: Sep. 9, 1986

[30] Foreign Application Priority Data

Oct. 1, 1985 [JP] Japan ................. 60-219867

[51] Int. Cl.⁴ .................... B05D 1/18
[52] U.S. Cl. .................. 427/430.1; 118/425; 118/429; 118/698; 134/57 R; 134/60; 137/256
[58] Field of Search ........... 427/430.1, 309, 444, 427/92; 118/698, 697, 425, 73, 429, 696, 699, 704, 707; 134/57 R, 60; 8/158; 364/490, 488, 489, 478, 500, 164, 165, 468; 156/345; 137/256, 255

[56] References Cited

U.S. PATENT DOCUMENTS

| | | | |
|---|---|---|---|
| 2,386,079 | 10/1945 | Weiskopf | 118/425 X |
| 3,165,108 | 1/1965 | Elliott et al. | 118/425 X |
| 3,641,906 | 2/1972 | Orr et al. | 134/57 R |
| 3,969,074 | 7/1976 | Chung | 68/62 X |
| 3,986,518 | 10/1976 | Sato | 134/57 R |
| 4,374,681 | 2/1983 | Schueneman | 118/697 X |
| 4,377,986 | 3/1983 | Juve | 118/425 X |
| 4,406,248 | 9/1983 | Araki et al. | 118/429 |
| 4,568,576 | 2/1986 | Minnie, Jr. et al. | 427/430.1 |

FOREIGN PATENT DOCUMENTS 52-150974 12/1977 Japan .

OTHER PUBLICATIONS

Nakamura, Masakatsu et al, "Overall Technology Review for Automation Systems for Modern Semiconductor Plants", Science Forum Company, Ltd., (1984) pp. 62-68.

Primary Examiner—Shrive Beck
Assistant Examiner—Alain Bashore
Attorney, Agent, or Firm—Lowe, Price, LeBlanc, Becker & Shur

[57] ABSTRACT

Treatment baths for surface treatment of semiconductor wafers by dipping thereof into a treatment liquid are arranged in a treatment bath train.

One or more selected treatment baths among these treatment baths are constructed to have a plurality of unit treatment vessels. The treatment liquid in these treatment vessels is replaced successively one by one of the unit treatment vessels. The semiconductor wafers are dipped in the treatment liquid contained in that unit treatment vessel that is not being subjected at that moment to the replacement of the treatment liquid.

8 Claims, 9 Drawing Sheets (a)

(b)

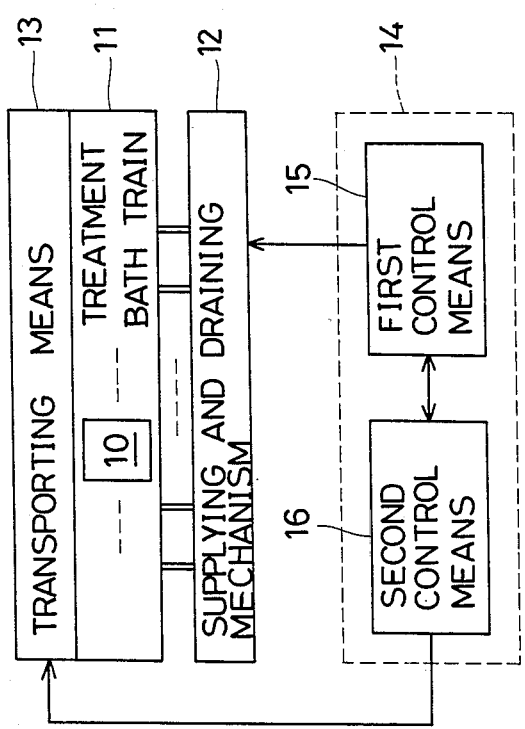

FIG. 6
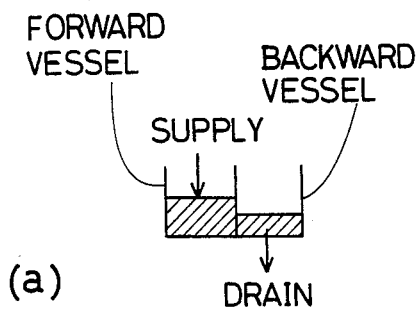
(a)
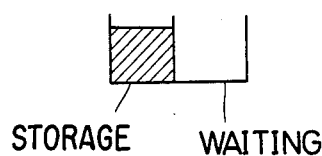
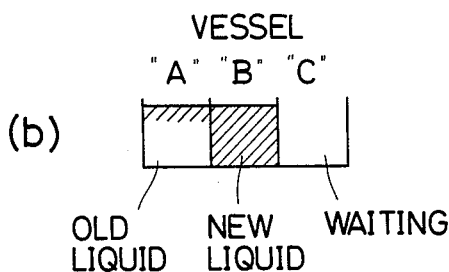
(b)
FIG. 5
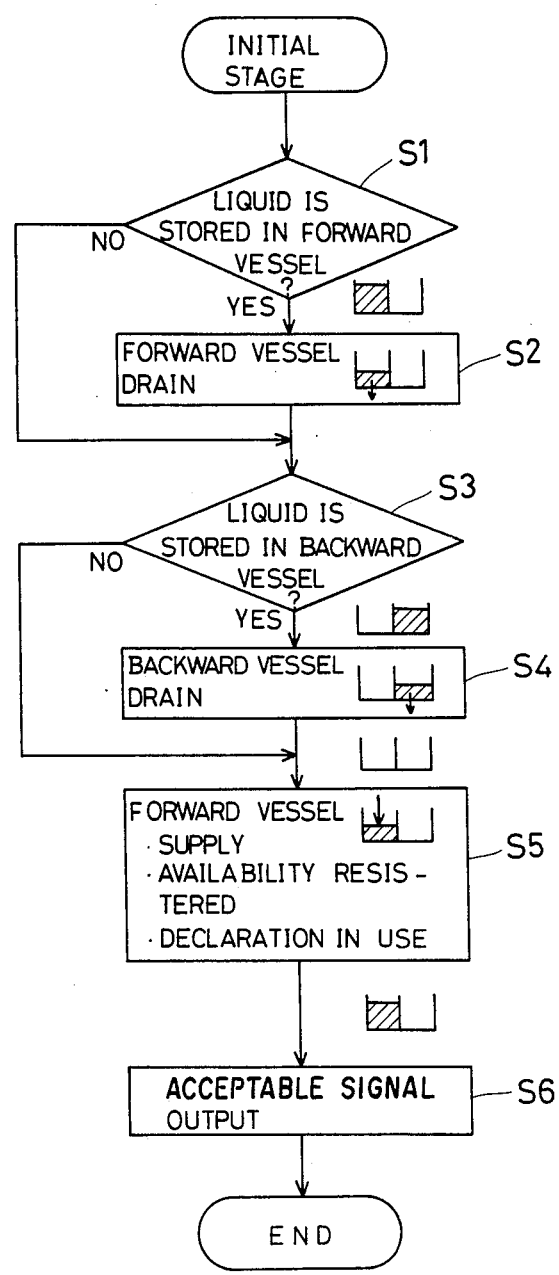

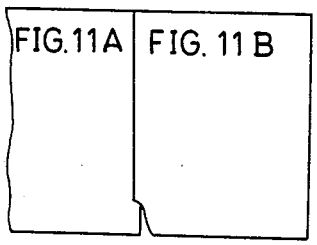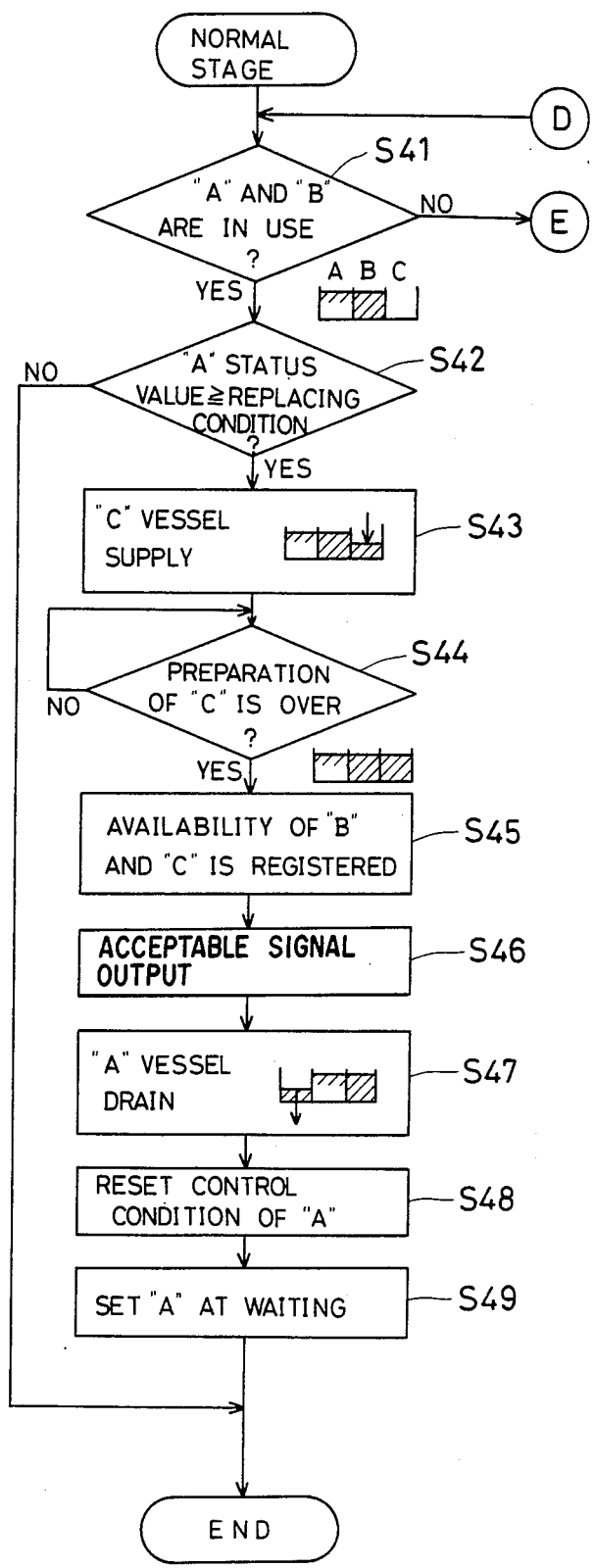

SURFACE TREATMENT METHOD AND APPARATUS THEREOF

BACKGROUND OF THE INVENTION

1. Field of the Invention

This invention relates to a method and apparatus for treating surfaces of objects such as semiconductor wafers (hereinafter called "wafers" for simplicity) and other small objects with chemical treatment liquid.

2. Description of the Prior Art

As well known in production processes of semiconductor devices, various surface treatments such as etching, removing of photoresist films, wafer cleaning, etc, are repeated. An apparatus available for achieving a series of such surface processings automatically is disclosed, for instance, in Japanese Patent Laying Open Gazette No. 52-150974 (1977), wherein various treatment baths and a drier are arranged in a line and a transfer machine or conveying machine moving along the line is provided. Cassettes each holding a lot consisting of a plurality of wafers are held by a handling mechanism of the transfer machine and dipped successively in treatment liquids filled in the treatment baths. Such treatment sequence is carried out automatically in response to command signals supplied from a controller comprising a microcomputer and others.

However, in the conventional treatment apparatus, the transport of cassettes should be interrupted momentarily during replacement or addition of the treatment liquids, which is required because of a deterioration of the treatment liquid due to the repeated dippings and the lapse of time. For example, consider an apparatus, illustrated schematically in FIG. 1 as a conceptional overview thereof, in which a loader L, treatment baths $P_1$, $W_1$ ... $W_4$, a drier D and an unloader UL are aligned along a transporting path of a transporting machine T so that the treatments are carried out in the order of the alignment. When the treatment liquid of the treatment bath $P_2$ is being replaced, the following cassette to be dipped in the bath $P_2$ should be kept waiting in the treatment bath $W_1$ positioned just before the bath $P_2$.

Therefore, the flow of the cassettes becomes intermittent, reducing the processing efficiency as a whole. Furthermore, during such replacement of the treatment liquid in one of the treatment baths, the deterioration of treatment liquids continues to take place in all other baths, resulting in a significant problem of inhomogeneous surface treatments of wafers lot by lot. Further, the number of replacements of the treatment liquids required for treatment of a certain number of lots is increased due to the deterioration, resulting in a low economical efficiency.

Especially, the integration density of integration circuits build up on surfaces of semiconductor wafers has increased recently, therefore, a provision of a dustfree atmosphere during formation of fine patterns and a uniform liquid quality control is important and is a big problem to be solved. To this end, liquids suffering rapid deterioration with time, for example, a cleaning liquid consisting of $H_2SO_4$ and $H_2O_2$, requires frequent replacement thereof and sometimes the replacement is necessary for every dipping of the wafers. Once the treatment liquid is drained once out of the bath, it takes a long time interval for cleaning of the inside of the bath, a supply of new liquid and the temperature increase thereof, while the bath cannot be used during such activity.

SUMMARY OF THE INVENTION

The present invention is directed to a surface treatment method of the batch type for transporting an object to be treated along a treatments bath train including a predetermined number of treatment bath and for dipping said object in a treatment liquid supplied in said treatment baths in a predetermined order thereby to execute a surface treatment of said object.

The surface treatment method according to the present invention comprises steps of: preparing a treatment bath train in which a desired treatment bath is constructed as a multi-vessel treatment bath comprising a plurality of unit treatment vessel; and replacing the treatment liquid in said multi-vessel treatment bath successively one by one in said unit treatment vessels and dipping said object in the treatment liquid in the unit treatment vessel which is not being subjected to replacement of the treatment liquid at that moment.

Apparatus for performing the surface treatment method described above is also provided in the present invention. As shown in the functional block diagram of FIG. 2, the apparatus comprises: a treatment bath train 11 consisting of a predetermined number of treatment baths, in which a typical predetermined treatment bath is constructed as a multi-vessel treatment bath 10 comprising a plurality of unit treatment vessels; a supplying and draining mechanism 12 for supplying and draining the treatment liquid in each unit treatment vessel; a transporting means 13 for transporting the object to be treated along said treatment bath train 11 and dipping the same in a predetermined order in the treatment liquids in the said treatment baths; and a control means 14 for excuting the transportation control of said transporting means 13 and the treatment liquid control of said treatment bath train.

The control means comprises: first control means 15 for replacing the treatment liquid in said multi-vessel treatment bath successively one by one in said unit treatment vessels through said supplying and draining mechanism; and second control means 16 for generating command signals for dipping the object in the treatment liquid in the unit treatment vessel not subjected at that moment to the replacement of the treatment liquid thereof and for transmitting said command signals to said transporting means 13.

According to one aspect of the present invention, the surface treatment method comprises the steps of: preparing a treatment bath train comprising a multi-group of unit treatment vessel obtained by combining two or more groups of unit treatment vessels; and replacing the treatment liquid in said multi-group of unit treatment vessels successively one by one of said groups of unit treatment vessel and dipping said object in the treatment liquid in the group of unit treatment vessel which is not subjected to the replacement of the treatment liquid at that moment.

In an apparatus for practicing the preferred embodiment, the treatment bath train comprises multi-group of unit treatment vessels constructed by combination of two or more groups of unit treatment vessel in which a desired plurality of unit treatment vessels are provided. A supplying and draining mechanism supplies and drains the treatment liquid in each unit treatment vessels of each group of unit treatment-vessel. Also provided is a control means for executing a control of a transporting mechanism which transports said object along said treatment bath train and dips the same in a predetermined order in the treatment liquid in the unit treatment vessels, and for executing a control of a treatment liquid in said treatment bath train. The control means comprises first control means for replacing the treatment liquid in said group of unit treatment vessel successively one by one in said unit treatment vessels through said supplying and draining mechanism, and second control means for generating command signals for dipping the object in the treatment liquid in the unit treatment vessel belonging to the group of unit treatment vessels not being subjected at that moment to the replacement of the treatment liquid thereof and transmitting said command signal to said transporting means.

It should be noted that the term "replacement" or "replacing" of the treatment liquid includes an addition or partial refilling thereof, in addition to full replacement of the treatment liquid, while the term "multi-vessel" or "multi-group" mean any installment of two or more vessels or groups with any associated relation respectively, requiring not necessarily a continuity in space, i.e., separated location of the components being allowed.

Accordingly, an object of the present invention is to provide a surface treatment method and apparatus thereof for treating objects such as semiconductor wafers or other small objects with a treatment liquid, in which a delay in the processing of the objects, due to replacement and draining of the treatment liquid, is not required and the surface treatment efficiency as a whole can be improved.

Another object of the present invention is to provide a surface treatment method and apparatus thereof, in which uniform surface treatment and high economical efficiency are obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a conceptional overview of a conventional surface treatment apparatus, FIG. 2 is a functional block diagram showing schematically the construction of an apparatus according to the present invention, FIG. 5, FIG. 7A and FIG. 7B are flow charts of the operations of the first embodiment, FIG. 6(a) and FIG. 6(b) are diagrams for explaining the symbols used in FIG. 5, FIG. 7A, FIG. 7B, FIG. 10, FIG. 11A and FIG. 11B, FIG. 10, FIG. 11A and FIG. 11B are flow charts showing the operations of the second embodiment, FIG. 11 is a diagram showing a combination of FIG. 11A and FIG. 11B, FIG. 13 is a conceptional overview of a surface treatment apparatus according to third embodiment of the present invention, and FIG. 14 is a conceptional overview of a surface treatment apparatus used in a modified embodiment of the present invention.

DETAILED DESCRIPTION OF THE PREFERRED EMBODIMENTS

First Embodiment

A. Construction of First Embodiment

Figure 3:
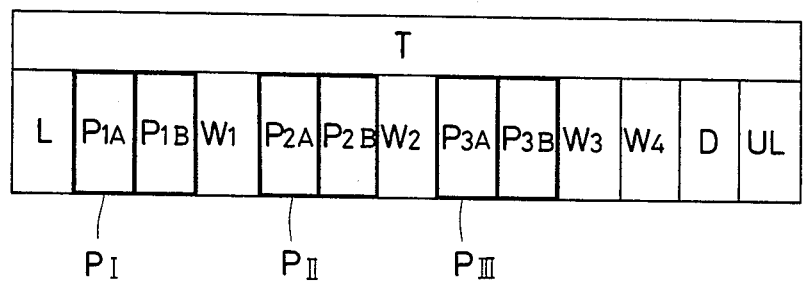
FIG. 3 is a conceptional overview of a surface treatment apparatus according to a first embodiment of the present invention.

FIG. 3 is a conceptional overview of a surface treatment apparatus for processing semiconductor wafers or substrates according to first embodiment of the present invention, which executes the treatments corresponding to the aforementioned apparatus of FIG. 1. The apparatus of FIG. 3 is a multi-bath batch type surface treatment apparatus for known RCA cleanings, which is described, for example, at page 63 and later in the "Review of Overall Technologies for Automation Systems of Modern Semiconductor Plants", issued by Science Forum Co., Ltd. 25th July 1984. The conventional apparatus of FIG. 1 is used similarly for the RCA cleanings and the following treatments are achieved in the treatment bath train.

| Treatment bath $P_1$ | Cleaning by ammonia and hydrogen peroxide solution |
|---|---|
| Treatment bath $P_2$ | Cleaning by diluted fluoric acid |
| Treatment bath $P_3$ | Cleaning by hydrochloric acid and hydrogen peroxide solution, |
| Treatment baths $W_1 \sim W_4$ | Rinsing by pure water |

On the other hand, in an embodiment of the present invention in FIG. 3, the treatment baths $P_I$, $P_{II}$ and $P_{III}$ corresponding to the treatment baths $P_1$, $P_2$, $P_3$ of FIG. 1 are formed as multi-vessel treatment baths comprising respective pairs of the unit treatment vessels ($P_{1A}$,$P_{1B}$), ($P_{2A}$,$P_{2B}$) and ($P_{3A}$,$P_{3B}$) for storing the same treatment liquid respectively. Therefore, the following treatments are carried out in each unit vessel.

Unit treatment vessels $P_{1A}$, $P_{1B}$
    Cleaning by ammonia and hydrogen peroxide solution
Unit treatment vessels $P_{2A}$, $P_{2B}$
    Cleaning by diluted fluoric acid
Unit treatment vessles $P_{3A}$, $P_{3B}$
    Cleaning by hydrogen peroxide solution In the multi-vessel treatment bath $P_I$, the treatment liquids in the unit treatment vessels $P_{1A}$ and $P_{1B}$ are replaced alternately. If the unit treatment vessel $P_{1A}$ is found in waiting status due to the replacement of the treatment liquid, the cassette holding a lot of semiconductor wafers as the object to be treated is dipped in the treatment liquid stored in another unit vessel $P_{1B}$, which is not being subjected at that time to replacement of the treatment liquid therein. The same selection rule of the unit vessel for dipping is applied similarly to the other multi-vessel treatment bath $P_{II}$, $P_{III}$.

Moreover, there is no need of replacement for the treatment liquid for the treatment baths $W_1 \sim W_4$, which are rinsing baths with continuous overflow of pure water. Therefore, these baths are not constructed as multi-vessel treatment baths, but as single treatment baths, similar to the apparatus shown in FIG. 1. The loader L, the drier D, the unloader UL and the transporting machine T are also located in the bath train similarly to that of the apparatus of FIG. 1.

Figure 4:
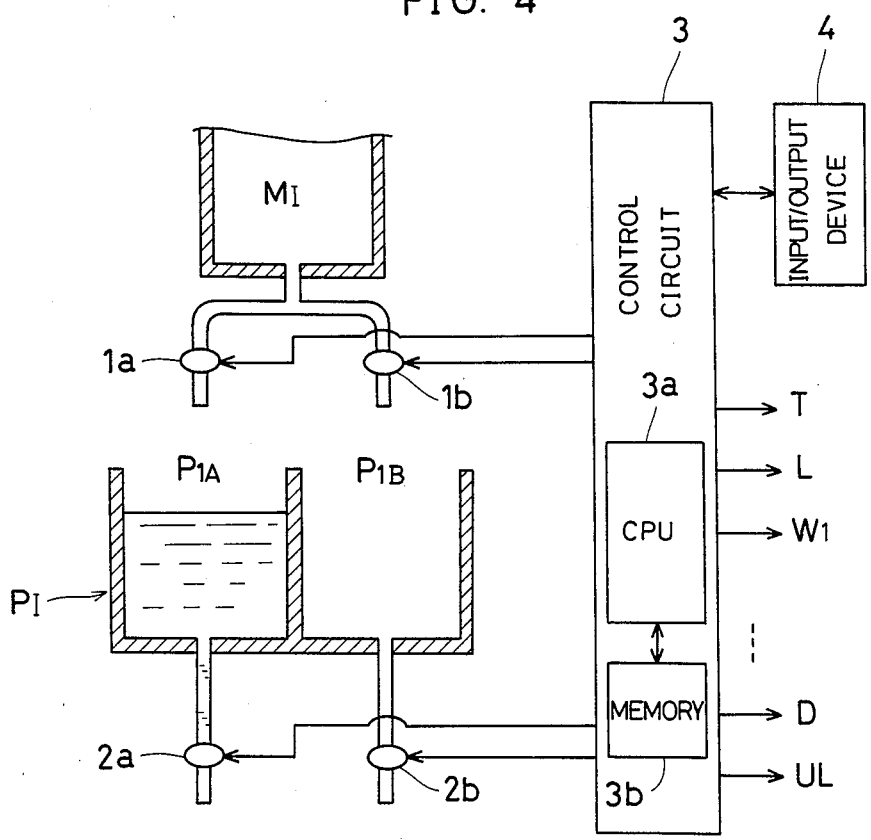
FIG. 4 is a schematic diagram of a control system of a multi-vessel treatment bath $P_1$ according to the first embodiment.

FIG. 4 is a schematic diagram of the control system for the multi-vessel treatment bath $P_I$ of FIG. 3. As explained above, the bath $P_I$ consists of two unit vessels $P_{1A}$, $P_{1B}$. A mixing tank $M_1$ for mixing chemicals to prepare the treatment liquids is positioned on these unit vessels. The treatment liquid prepared therein is supplied into the unit vessels $P_{1A}$, $P_{1B}$ respectively through solenoid valves 1a, 1b as part of the liquid supplying and draining mechanism thereof. The used treatment liquid is drained through solenoid valves 2a, 2b provided at the bottom of the unit vessles $P_{1A}$, $P_{1B}$.

All these solenoid valves 1a, 1b, 2a, 2b are connected to and controlled by a control circuit 3 consisting of microcomputers, sequencers and others, which comprises CPU 3a and a memory 3b. The control circuit 3 is connected in turn to the transporting machine T, the loader L, the other treatment baths $W_1$..., the drier D and the unloader UL, in addition to an input/output device 4 such as a keyboard and a CRT. Particularly for the multi-vessel treatment baths $P_{II}$, $P_{III}$ among respective treatment bath $W_1$..., the control circuit 3 is connected to the solenoid valves for supplying and draining the treatment liquid in each unit treatment vessel, similarly to the treatment bath $P_I$. Through these connections, the control circuit 3 carries out the control of transportation and replacement of treatment liquids, which will be described later. Of course, metering of liquid components and control of the liquid temperature are also carried out, though the mechanism thereof is not shown in FIG. 4.

B. Procedures for Replacement of Treatment Liquid in the First Embodiment

The replacement procedures in the first embodiment will now be described, separately for procedures before dipping of first lot (initial stage) and for subsequent procedures (normal stage). The procedures belong to a control routine through the control circuit 3 of FIG. 4.

B-1 Procedures for Replacement of Treatment Liquid at the Initial Stage

The following description is made with reference to FIG. 5 showing a flow chart for replacing of treatment liquid at the initial stage. In the following description, the term "forward vessel" means a unit vessel positioned at the side of the loader L (i.e. a forward side) and the term "backward vessel" means a unit vessel positioned at the side of the unloader UL (i.e. a backward side). The liquid storage states in each unit treatment vessel in the main steps of the control sequence are shown schematically in FIG. 5 and other flow charts. The meanings of the symbols used for representing the storage states are shown in FIG. 6(a), i.e., the arrow marks from the upper side indicate supply of the treatment liquid, while the arrow marks to the lower side indicate drainage thereof. Moreover, hatching in the unit vessel represents storage of the treatment liquid. The following description will be given for only one multi-vessel treatment bath, but is applicable similarly for the other multi-vessel treatment baths belonging to the bath train.

At first, in the step S1 of FIG. 5, it is judged whether the treatment liquid is stored or not in the forward vessel, and if stored, the treatment liquid is drained in the step S2. Then, the storage of the treatment liquid is judged for the backward vessel and the treatment liquid if stored is similarly drained (step S3, S4). Therefore, both the forward and backward vessels are vacant at the moment when the step S4 is over. The judgement for storage of treatment liquid in the above steps may be achieved with reference to flags being set up in registers (not shown) or other elements within the control circuit 3 for indication of the storage state of the treatment liquid in each unit vessel.

Then, the treatment liquid is supplied to the forward vessel in the following step 5 while the temperature control is also carried out. The availability of this forward vessel is registered through a setting of a flag and it is declared that the forward vessel is found in the use. Namely, the control is so designed that the dipping of the cassette is always started from the forward vessel at the initial stage. In step S6, a cassette acceptable signal indicating a acceptable condition of the cassette is transmitted to the control unit (not shown) of the transporting machine T to terminate the routine at the initial stage.

B-2 Procedures for Replacement of Treatment Liquid in the Normal Stage

The replacing procedures of treatment liquid in the normal stage (FIG. 7A and FIG. 7B) will now be described. These control procedures take place in parallel with the transporting and dipping procedures of the cassettes, which will be described later. At first, in the step S11 of FIG. 7A, it is estimated and judged whether when the next lot is dipped in the treatment liquid in a unit vessel currently found in the use, expected number of treatments corresponding to the total namber of lots (more precisely, the total number of wafers) dipped in the treatment liquid in the unit vessel will remain below the maximum value allowed for the treatment liquid. The maximum value is stored previously in the memory 3b of the control circuit 3 or others.

If the expected number of treatments will exceed the maximum value, the routine proceeds to step S14. On the other hand, if the expected number will remain below the maximum value, there is no need of the replacement for treatment liquid and it is estimated in the next step S12 whether the treatment of the next lot in the unit vessel can be completed or not within the remaining life time of the treatment liquid currently used. Of course, it is necessary to store in memory 3b previously a life time value of the treatment liquid and an estimate of the time period (i.e., standard time) required for the dipping. It is also necessary to count by a timer the time lapse from the previous replacement of the treatment liquid.

Figure 7A:
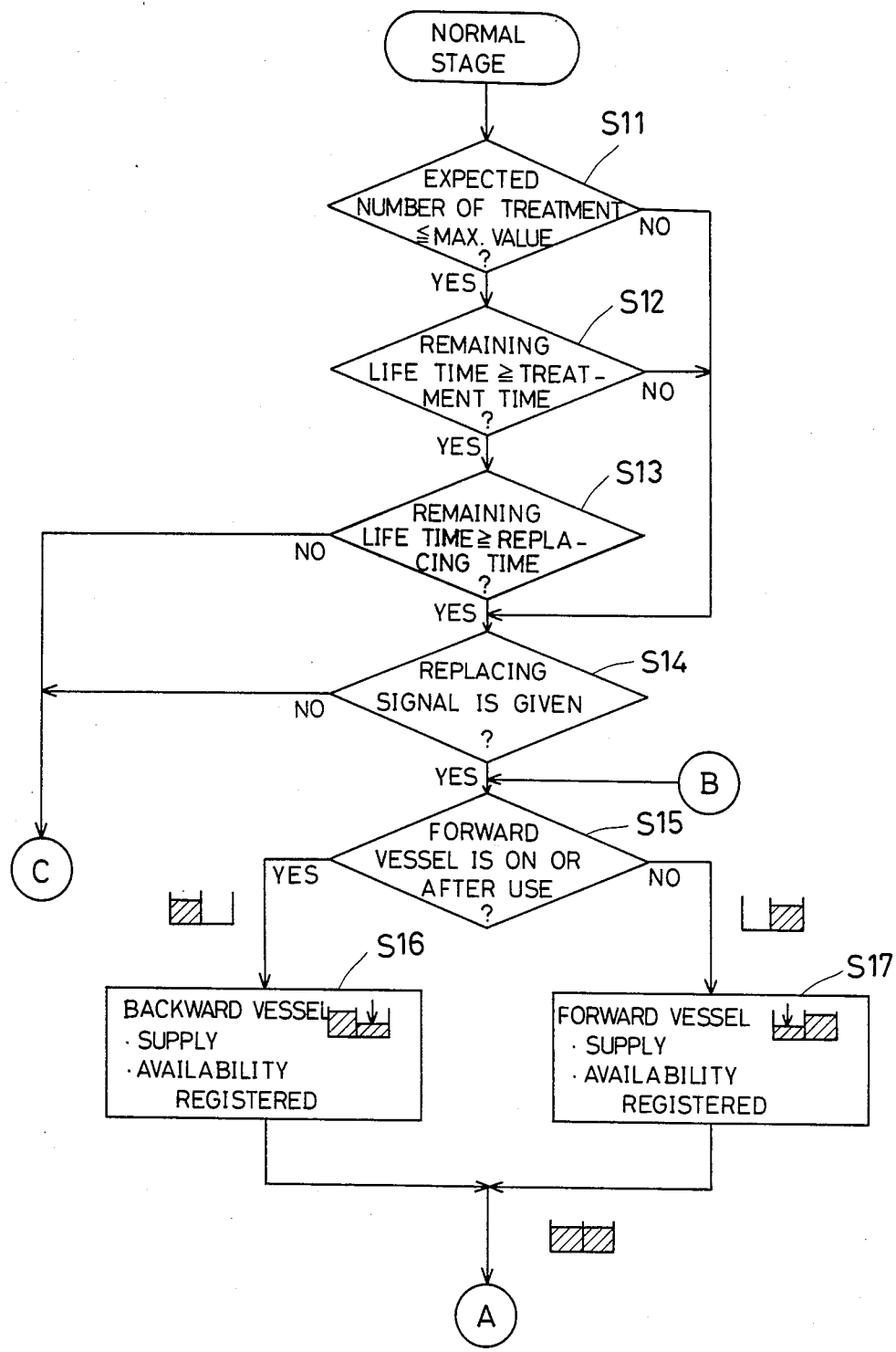

If it is judged that the treatment in the unit vessel can be completed within the remaining life time, the remaining life time is compared in the next step S13 with the expected time required for replacing the treatment liquid. If the remaining life time is equal to or longer than the time required for replacing the treatment liquid, there is no need of the replacement at the current stage and thus the routine is completed without the replacement. On the other hand, if the remaining life time is shorter than the time required for replacing the treatment liquid, the step is forwarded to the step S14, where it is judged whether an instruction signal for replacing the treatment liquid is given or not. The aforementioned instruction signal for replacing the treatment liquid is generated in the control circuit 3 to indicate whether the routine following the step S15 for replacing the treatment liquid should be actually started or not, taking the running condition of the overall system into consideration. The control may be arranged in such a manner that the routine of FIG. 7A is not started if there are no instructions for replacing the treatment liquid, in place of the above indicated procedure.

If there are no instructions for starting the routine of replacing the treatment liquid, the replacement does not take place, while if the instruction is found, it is judged in the next step S15 whether the forward vessel is in or after the use. If the forward vessel is found in or after the use, the treatment liquid is supplied in the next step S16 to the backward vessel being kept at waiting and the availability of the backward vessel is registered.

If the forward vessel is found not in or after the use, the forward vessel is retained in the waiting condition and reversely the backward vessel is in or after the use. Therefore, the treatment liquid is supplied to the forward vessel in the step S17 and the availability of the forward vessel is registered. When either the step S16 or the step S17 is over, it is normally found that the treatment liquid is stored in both of the forward and backward vessels.

Figure 7B:
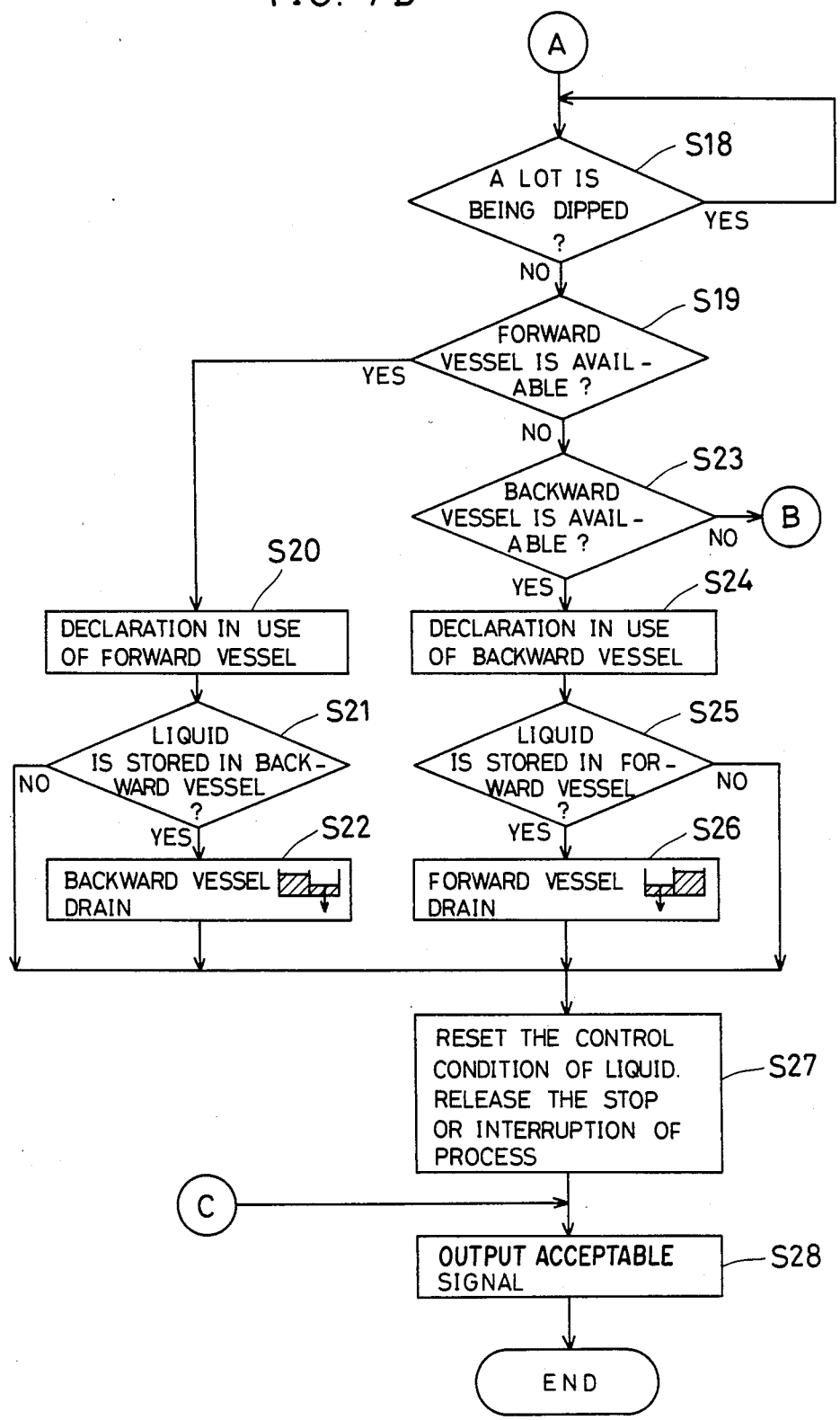

In the next step S18 of FIG. 7B, it is judged whether there is a lot being dipped at that moment in the corresponding treatment bath. This judgment may be achieved, for example, by referring detection signals indicating the presence or the absence of the cassette supplied from a photoelectric sensor (not shown) located near an upper part of the treatment bath or signals from the routine to control the transporting machine T. If there is any lot under treatment, the waiting condition is set. On the other hand, if there are no lots or the lot disappears, it is judged in the next step S19 whether the forward vessel is available or not, in other words, a new supply of the treatment liquid has been supplied to the forward vessel or not. This is identical with the judgement whether the step S17 is executed or not. If the forward vessel is available, it is declared in the step S20 that the forward vessel is now in use and then it is judged in the step S21 whether the treatment liquid is stored or not in the backward vessel. If stored, the treatment liquid is drained in the step S22.

On the other hand, if it is judged in the step S19 that the forward vessel is not available, it is judged in the step S23 whether the backward vessel is now available or not. If either the forward or the backward vessel is not available, the routine is returned to the step S15 of FIG. 7A to supply the treatment liquid to one of the two vessels. On the other hand, if the step S16 has been executed and the backward vessel is available, the steps S24–S26 obtained by interchanging the "forward vessel" and the "backward vessel" in the steps S20–S22 are executed and the treatment liquid in the forward vessel is drained.

When the treatment liquid is supplied to any one unit vessel and it is declared that the unit vessel is in the use while the other unit vessel in use up to that time moment is perfectly drained, the sequence is advanced to step S27. In the step S27, the control conditions of the treatment liquid is reset and at the same time the stop or the interruption of the other processing is released. Thereafter, in the step S28, a signal indicating the acceptability of the cassette is generated and transmitted to the transporting machine T and the routine is completed. These routines may be repeated appropriately.

C. Dipping Procedures in the First Embodiment

In parallel to such replacing procedures of the treatment liquid, the transporting and dipping procedures of the lot consisting of, for example, twenty-five semiconductor wafers, are executed. The construction used for conventional apparatus may be applied directly for the transporting machine T and individual dipping sequences. A processing characteristic in this embodiment is a selection procedure of the unit vessel to be used for the dipping. The selection procedure may be executed by detecting the unit vessel for which a declaration of use is found under the condition that the cassette acceptable signal is outputted, and then generating and outputting a command signal indicating the declared vessel to the transporting mechanism T. On receiving the command signal, the transporting mechanism T transports the cassette to the indicated unit vessel and dips the same in the treatment liquid in the unit vessel.

As described above, in this embodiment, the treatment liquid is replaced in the forward and backward vessels alternatively and the lot is dipped alternatively in the treatment liquid in the unit vessel in which new treatment liquid has been supplied. The dipping time period of the lot in the treatment liquid in each unit vessel depends upon the chemical quality of the treatment liquid.

Second Embodiment

D. Construction of the Second Embodiment

Figure 8:
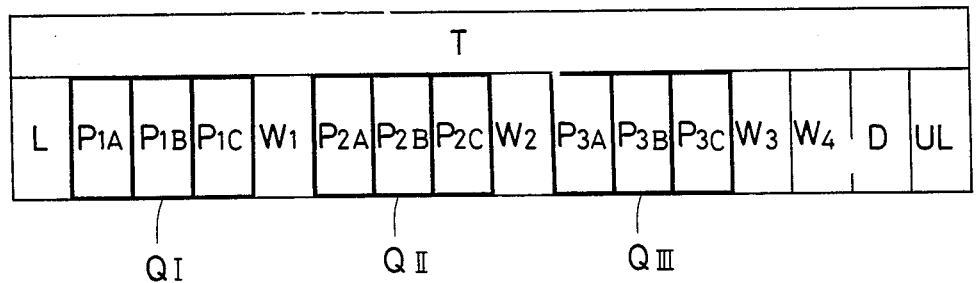
FIG. 8 is a conceptional overview of a surface treatment apparatus used in second embodiment.
Figure 9:
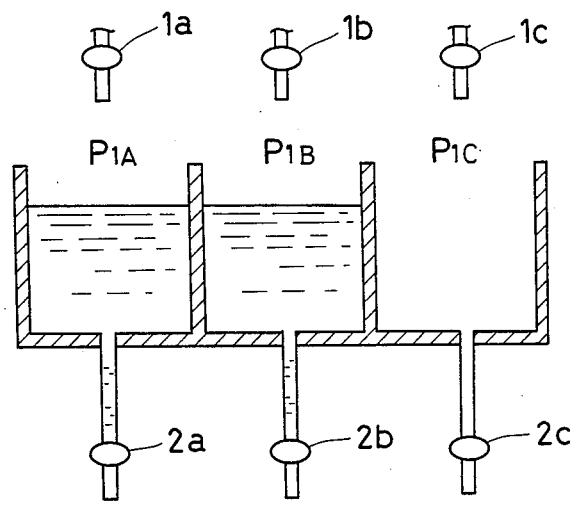
FIG. 9 is a diagram showing a partial model of a multi-vessel treatment bath $P_1$ in the second embodiment.

The second embodiment of the present invention will be described. Corresponding to the treatment baths $P_I$, $P_2$ and $P_3$ of FIG. 1, the second embodiment of FIG. 8 is provided with the multi-vessel treatment baths $Q_I \sim Q_{III}$, which consist of respective three unit vessels ($P_{1A}$, $P_{1B}$, $P_{1C}$), ($P_{2A}$, $P_{2B}$, $P_{2C}$) and ($P_{3A}$, $P_{3B}$, $P_{3C}$). The solenoid valves $1a–ic$, $2a–2c$ are also attached to each treatment bath, as shown in FIG. 9. The difference between the first and second embodiments is found in the fact that not only the number of the unit vessels is increased, but one among two unit vessels (e.g., $P_{1A}$ and $P_{1B}$ in FIG. 9) is filled with a treatment liquid with relatively short time lapse from the supply thereof ("new liquid"), while the other vessel is filled with treatment liquid with relatively long time lapse from the supply thereof ("old liquid"). When a new treatment liquid is supplied to the unit vessel (e.g., $P_{1C}$ in FIG. 9) found at the waiting condition, the old liquid is drained while the treatment liquid considered as the new one up to that moment is, in turn, considered as an old liquid.

Thus, a new liquid vessel, an old liquid vessel and a waiting vessel are prepared cyclically and the lot is dipped in the old liquid at that time moment and then redipped in the new liquid, assuring nearly the same quality surface treatment to any lot, regardless of the timing when the lot is transported in the corresponding treatment bath. Therefore, it is possible to avoid fluctuation of treatment quality in accordance with the deterioration stage of the treatment liquid at the time moment of the lot dipping.

E. Procedures for Replacement of Treatment Liquid in the Second Embodiment

E-1. Procedures for Replacement of Treatment Liquid at Initial Stage

Figure 10:
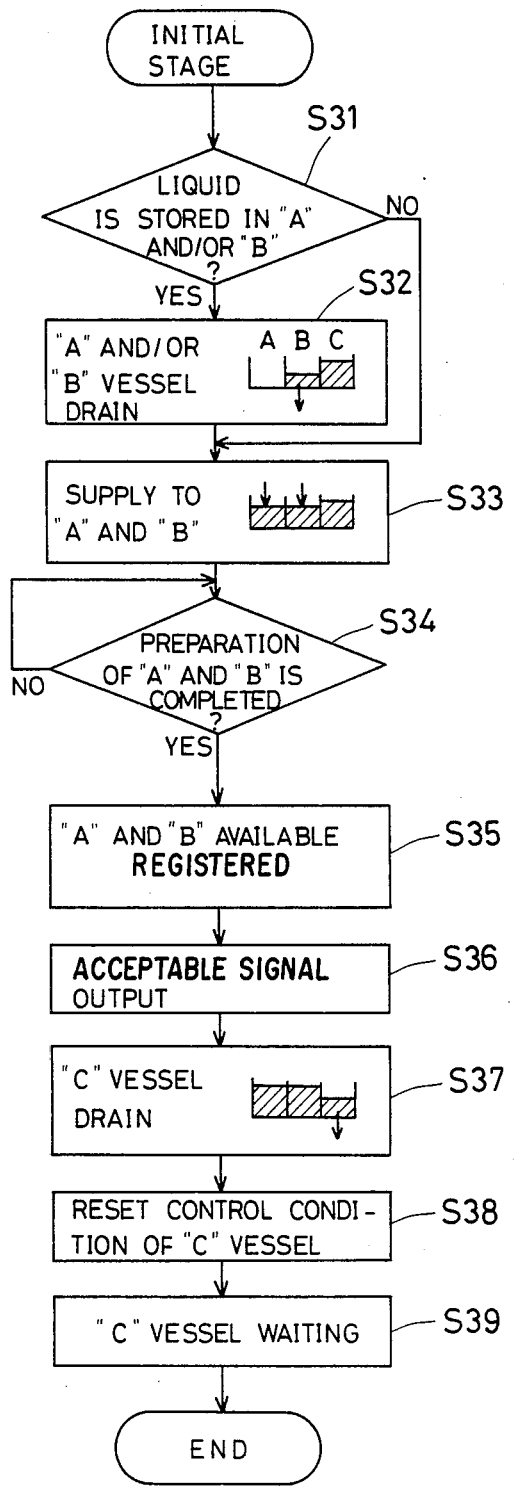
Figure 11B:
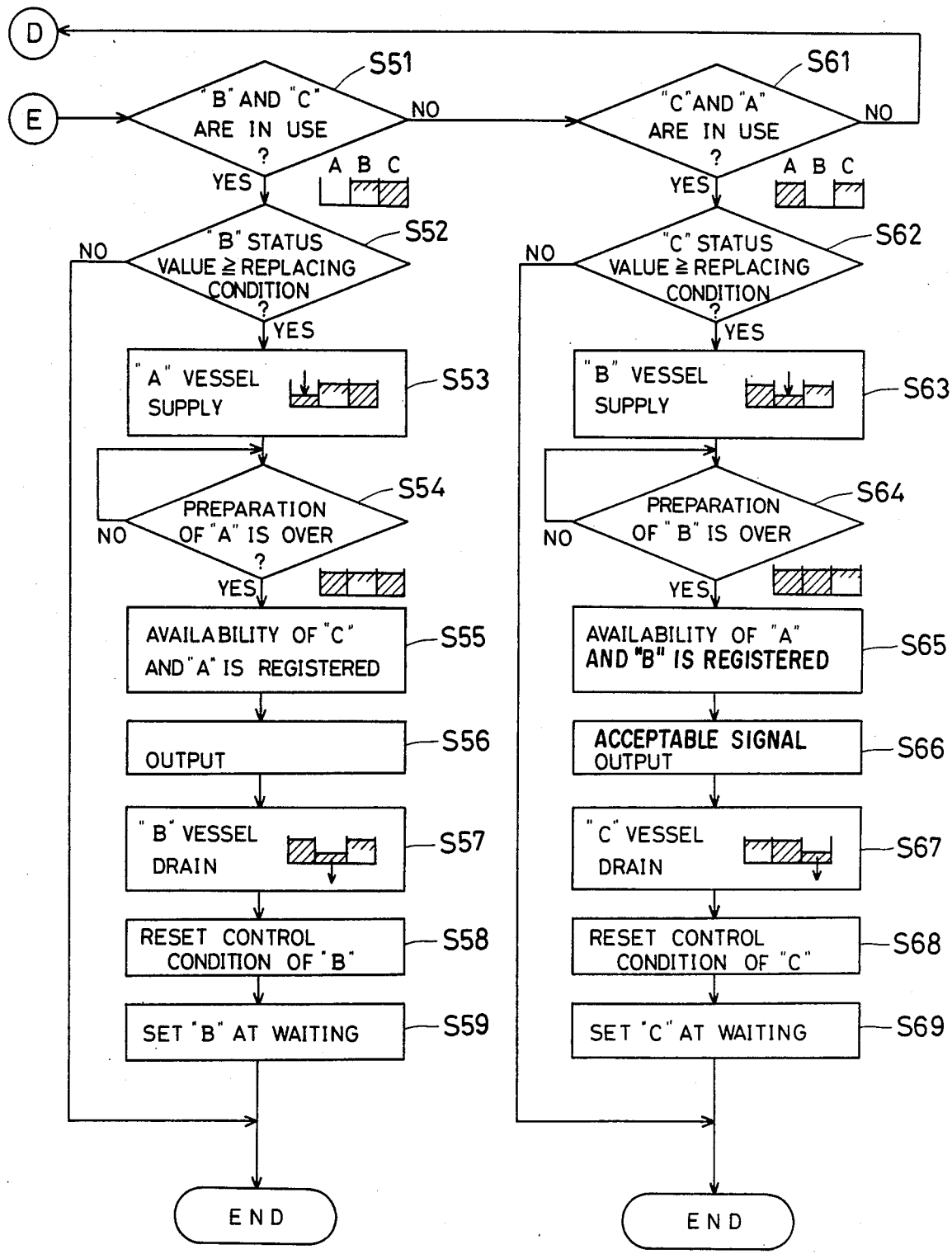

As with the first embodiment, the procedures for replacement of the treatment liquid at the initial stage will be described first. For better understanding of the second embodiment, symbols shown in FIG. 6(b) are used in the operation flows thereof (FIG. 10, FIG. 11A and FIG. 11B). Namely, the three unit vessel are referred as "A vessel", "B vessels" and "C vessel" successively from the side of the loader L and the new liquid is indicated by full hatching in the symbols, while the old liquid is indicated by partial hatching.

In FIG. 10, showing the replacing procedures at the initial stage, it is judged at first in the step S31 whether the treatment liquid is stored or not in the A and/or B vessel. If stored, the treatment liquid is drained in the next step S32 from the unit vessel storing the treatment liquid. If the treatment liquid is stored in both the A and B vessels, the treatment liquid in both vessels are drained. It is supposed in FIG. 10 that the treatment liquid is stored in the B and C vassels. Therefore, in this example, the treatment liquid is drained from the B tank. In the step S33, the treatment liquid is supplied to the A and B vessels and then, it is judged in the step S34 whether the temperature adjustment is completed and the dipping preparation for receiving a lot is over or not.

When the dipping preparation is completed, it is registered in the step S35 that the both A and B vessels are available and the signals indicating a cassette acceptable signal are output in the step S36. Furthermore, the liquid in the C vessels is drained in the step S37 and the control condition of the treatment liquid is reset for the C vessel in the step S38. The C vessel is returned to the waiting state in the step S39 to complete the initial routine. Therefore, when the initial routine is completed, both of the A and B vessels are ready for dipping any lot.

E-2 Procedures for Replacement of Treatment Liquid at the Normal Stage

FIG. 11A and FIG. 11B are partial flow charts showing the replacing procedures at the normal stage, and they are combined as shown FIG. 11 to form a signal flow chart. It is judged in the step S41 of FIG. 11A whether A and B vessels are those found presently in use or not. If yes, the routine is forwarded to the step S42. As clearly understood from the routine described later, the treatment liquid is cyclically replaced in the order of the A, B and C vessels. Therefore, when the A and B vessels are in use, it is understood that a new liquid or liquid considered as new is stored in the B vessel.

In the next step S42, it is judged whether the status values indicating dip processing progress, such as the finish time of the treatment and the total number of the dips reach the conditions reserved for starting the replacing of the treatment liquid of the A vessel, such as the remaining life time and the allowable maximum number of treatments when the next lot is dipped without a replacement of the liquid. This judgment corresponds to the steps S11–S13 of FIG. 7A.

If it is found that these conditions are satisfied, the treatment liquid is supplied to the C vessel at the waiting condition for preparing the dipping. When the preparation is over, the availability of the B and C vessel is registered (the step S43–S45). Then, the lot acceptable signal is output and the liquid in the A vessel is drained (the step S46, S47). Therefore, from that moment, the treatment liquid in the B vessel is considered as old while the treatment liquid in the C vessel is considered as new.

After resetting the control condition of the treatment liquid in the A vessel, the emptied A vessel is set at the waiting condition (the step S48, S49), completing the routine for the first cycle.

When the routine is repeated again from the threshold thereof, the old and new liquids are found in the B and C vessels respectively. Therefore, the steps S52–S59 of FIG. 11B are executed through the steps S41 and S51. These steps S52–S59 correspond to the aforementioned steps S42–S49, in which the A, B and C vessels are cyclically shifted by one vessel. Thus, if the step S59 is over, the old and new liquids are found in the C and A vessels respectively at this time.

At the third cycle, the routine reachs to the step S61 of FIG. 11B through the steps S41 and S51, and the steps S62–S69 with similar cyclic permutation are further executed and then the A vessel is filled with old liquid while the B vessel is filled with new liquid.

In summary, the following three conditions are repeated cyclically.

| | | |
|---|---|---|
| A (old liquid), | B (new liquid), | C (waiting) |
| A (waiting), | B (old liquid), | C (new liquid) |
| A (new liquid), | B (waiting), | C (old liquid) |

Figure 12:
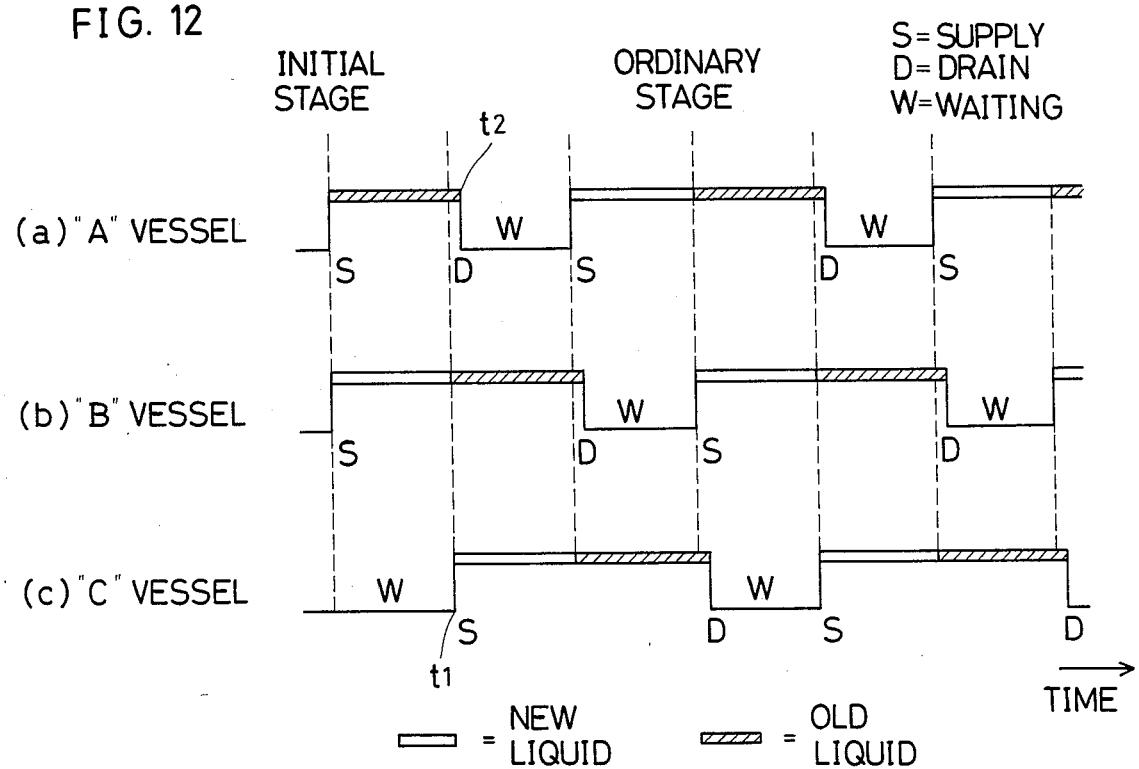
FIG. 12 is a timing chart for replacement of the treatment liquid.

FIG. 12 is a time chart showing the above repetition, wherein the new and old liquid are indicated by a white band and a hatchied band respectively. Furthermore, the symbols "S", "D" and "W" indicate "supply", "drain" and "waiting", respectively. As clearly understood from FIG. 12, unit vessels containing the new and old liquid are always found, while the remaining vessel is kept at the waiting condition. Moreover, there is a slight difference between the supply starting time $t_1$ of the treatment liquid of one vessel and the drain starting time $t_2$ of the another vessel, because the processing of FIG. 11A and FIG. 11B defines the sequence, in which the drain is started after the supply is over. The time duration of each condition in the time chart depends upon the incoming frequency of lots.

F. Dipping Procedures of the Second Embodiment

In this embodiment, the treatment liquid is replaced cyclically so that the lot is dipped in the old and new liquid, the dipping time thereof being determined by the character or the condition of the treatment liquid. For example, if the dipping time period in the old and new liquid is $t_a$ and $t_b$ respectively, the condition $t_a > t_b$ or $t_a = t_b$ may be allowed according to the quality or the character of the treatment liquid and other. Namely, it is possible to preset $t_a$ and $t_b$ appropriately by taking the character of the liquid into consideration. Thus, any lot can be treated with the treatment liquid having a nearly constant chemical effectivity, assuring the uniformity of treatment of the objects. As with the first embodiment, the presence or the absence of the registration of use is referred to in order to judge what unit vessel should be used for dipping. It is easy to check which treatment liquid is old, if the aforementioned cycling order is established previously.

Moreover, while one lot is dipped in the new liquid, the next lot may be dipped in the old liquid. In this case, it is unnecessary to keep the lot in the waiting condition thereof and overall flow of the lots becomes smooth.

Third Embodiment

G. Construction of the Third Embodiment

FIG. 13 is a schematic overview of the third embodiment of the present invention. In this apparatus, among the treatment baths of a conventional apparatus shown in FIG. 1, a plurality of the treatment baths (unit treatment vessels) corresponding to, for example, the treatment baths $P_1$, $W_1$, $P_2$, $W_2$, $P_3$ and $W_3$, are arranged one by one to provide three unit groups of unit treatment vessels; $P_A$, $P_B$ and $P_C$, which are composed as follows;

$$P_A = (P_{1A}, W_{1A}, P_{2A}, W_{2A}, P_{3A}, W_{3A})$$
$$P_B = (P_{1B}, W_{1B}, P_{2B}, W_{2B}, P_{3B}, W_{3B})$$
$$P_C = (P_{1C}, W_{1C}, P_{2C}, W_{2C}, P_{3C}, W_{3C})$$

These three unit groups of unit treatment vessels, $P_A$, $P_B$ and $P_C$ are successively associated to provide the multi-group of treatment vessels ($P_A + P_B + P_C$).

In other words, the multi-vessel treatment bath is composed by a plurality of unit treatment vessels in the first and second embodiment, while the multi-group of treatment vessel is composed by a plurality of the unit groups of treatment vessels or unit groups of treatment bath.

The loader L, the treatment bath $W_4$ and the drier D are used commonly for every baths belonging to a treatment bath train. Each unit treatment bath in each unit group of treatment baths $P_A$, $P_B$, $P_C$ is provided with solenoid valves and the related piping for supplying and draining the treatment liquid as described in the earlier discussions of the first and second embodiments.

One among the three unit groups of treatment vessels $P_A$, $P_B$, $P_C$ is used for waiting for the replacement of the treatment liquid and the lot is dipped successively in the remaining two unit groups of treatment vessels. The former one unit group of treatment vessels for the waiting is selected cyclically among the three unit groups of treatment vessels $P_A$, $P_B$, $P_C$, as was the selection of one among three unit treatment vessels in the second embodiment.

The unit groups of treatment vessels $P_A$, $P_B$, $P_C$ may constructed by a required plurality of the treatment vessels, not limited to the aforementioned construction.

H. Replacing Procedures of Treatment Liquid

The fundamental operating procedures of this third embodiment are obtained by reading each unit treatment vessels A, B and C in FIG. 10, FIG. 11A and FIG. 11B as the unit groups of treatment vessel $P_A$, $P_B$ and $P_C$ respectively.

However, the status judgment of the treatment liquid in each unit group of treatment vessels is executed by overall judgment of the respective status of the treatment liquid in each unit treatment vessel (other than water rinsing baths) belonging to the corresponding unit group of treatment vessels. For instance, when the status values such as the life time and the dipping number of the treatment liquid in at least one (for example, $P_{1A}$) among unit treatment vessels belonging to one unit group of treatment vessels (for example, $P_A$) reach the values predetermined for the replacing, the unit group of treatment vessels ($P_A$), as a whole, is switched over to the waiting status. In this waiting status, all liquid in respective unit treatment vessels belonging to the unit group of treatment vessels ($P_A$) is drained and replaced with new liquid. As described with respect to the second embodiment, it is not necessarily required that old and new liquid are prepared and the lot is dipped at first in the unit group of treatment vessels containing the old liquid. Other modifications described for the first and second embodiment are also applicable in connection with this embodiment.

The dipping procedures for this embodiment will be clearly understood from the aforementioned description, therefore, further explanation is omitted.

Modifed Embodiments

The present invention is not limited to the aforementioned embodiments, and the following modifications may be applied to the present invention.

(1) The number of the unit treatment vessels composing the multi-vessel treatment bath may be more than four. If the dipping times in the multi-vessel treatment baths are different from each other, each of the multi-vessel treatment baths can comprise a different number of the unit treatment vessels. For instance, suppose that the dipping continues for t, 2t and 3t minutes in the multi-vessel treatment baths $R_I$, $R_{II}$, and $R_{III}$, of FIG. 14, respectively. In this case, as shown in FIG. 14, the multi-vessel treatment baths $R_I$, $R_{II}$ and $R_{III}$ are constructed of two ($P_{1A}$, $P_{1B}$), three ($P_{2A}$, $P_{2B}$, $P_{2C}$) and four ($P_{3A}$, $P_{3B}$, $P_{3C}$, $P_{3D}$) unit treatment vessels, respectively. In this situation, one of the unit vessels belonging to each multi-vessel treatment bath is cyclically selected to be used as a waiting bath while the dipping time in the other unit treatment vessels is set to t min each, thereby to obtain the desired total dipping time. An effect similar to that of the aforementioned second embodiment will be realized by constructing the multi-vessel treatment bath with the number of the unit treatment vessels corresponding to the time required for the dipping and by setting the dipping time to each unit treatment vessel to be identical each other.

(2) In the above embodiment, the time moment for replacing is determined, taking the life time of the treatment liquid and the dipping number of the lot into consideration. If it is known, however, that the lots are taken in at nearly the same time interval, the time moment can be determined by only one aforementioned factor taking place earlier.

(3) In the above embodiment, the waiting vessel is kept empty up to the time moment just before the start of draining the other unit treatment vessel, in order to avoid deterioration of the treatment liquid during the waiting. However, it is also possible to set the unit vessel in waiting after the supply of the treatment liquid. Namely, when the treatment liquid requires a relatively long time for the temperature control and other factors, the treatment liquid may be supplied without a long delay after the drain and the unit treatment vessel may be kept in waiting with the progress of such operations. Moreover, the supplying and draining of the treatment liquid can be carried out manually or semi-automatically.

(4) In the aforementioned first and second embodiments, three processing tanks $P_I \sim P_{III}$ are constructed as the multi-vessel treatment bath, however, it is not inhibited to construct a part thereof as the multi-vessel treatment bath.

Particularly in a cleaning treatment bath, which decomposes organic substances adhered on the surface of a seniconductor wafers with a mixed liquid of $H_2SO_4$ and $H_2O_2$ at temperature higher than 100° C., the liquid quality is deterioratied quickly by the time lapse only. Therefore, the treatment liquid should be fully replaced every one or two dippings of the wafers. In such a case, only the treatment bath for such treatment liquid can be constructed by two or more unit treatment vessels. Furthermore, this invention can be applied to any treatment bath train consisting of one type of treatment bath only.

(5) Any combination of the aforementioned drying and other processings with chemical treatment in the treatment bath is allowed. This invention is applicable to full replacing of the treatment liquid and to partial replacement such as addition of some amount thereof. Types of objects to be treated and objects of the surface treatments impose no limitation to this invention, which is also applicable to general platings in addition to surface treatment of glass substrates for photoetchings.

(6) FIG. 4 and FIG. 6 show the multi-vessel treatment bath integrally associated in spaced relation, however, the baths may be installed separately.

According to this invention as described above, a required treatment bath or a plurality of required treatment baths are constructed as a multi-vessel treatment bath or a multi-group of unit treatment vessels while the replacing of the treatment liquid is executed successively by unit treatment vessels or a unit group of unit treatment vessel. Therefore, the unit treatment vessel or the group thereof for which the replacing operation is not currently executed can be found at all times, making unnecessary the waiting operation of the objects to be treated and improving overall efficiency of the surface treatments. There are substantially no deteriorations of the treatment liquid in the treatment baths due to the waiting of the objects, thus enabling realization of an economical surface treatment method and apparatus. The surface treatment of the objects may be executed more uniformly, as compared with conventional methods.

Particularly for objects in current demand such as semiconductor wafers with high integration density, it is sometimes required that the treatment liquid shoud be replaced with new liquid for each dipping operation. Further, in case treatment liquids with quick deterioration character should be used, the liquids sometimes must be replaced without any dipping due to the deterioration caused only by the time lapse. If this invention is applied in such cases, a continuous surface treatment is assured by constructing the required treatment baths as multi-vessel treatment baths comprising a plurality of unit treatment vessels. There is then no need for keeping the objects to be treated in waiting during the time span required for draining the treatment liquid and cleaning the bath to improve the productivity. If there are two or more treatment baths with high replacement frequency, the treatment efficiency can be improved further by constructing these baths as multi-vessel treatment baths. The surface treatments under the same condition can thus assure uniform quality of the treated objects.

When predetermined numbers of the treatment baths or predetermined groups thereof are constructed as the multi-vessel treatment bath or a group thereof, the space required for clean rooms and others is reduced with higher productivity and better quality of the treatment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface treatment method of batch type for transporting an object to be treated along a treatment bath train including a predetermined number of treatment baths and for dipping said object in a treatment liquid supplied in said treatment baths in a predetermined order, thereby to execute a surface treatment of said object, said surface treatment method comprising the steps of:

preparing a treatment bath train comprising a plurality of treatment baths, in which a desired treatment bath is constructed as a multi-vessel treatment bath comprising a pair of unit treatment vessels each of which contains the same treatment liquid;

replacing the treatment liquid in one of said unit treatment vessels every time that predetermined conditions are satisfied in such a manner that at least one of said pair of unit treatment vessels at all times contains said treatment liquid for allowing said surface treatment of said object therein; and transporting said object along said treatment bath train to dip said object in the treatment liquid in only one of the pair of unit treatment vessel which is not being subjected to the replacement of treatment liquid, a dipping time period in each unit treatment vessel of said multi-vessel treatment bath being determined according to a characteristic of the treatment liquid therein.

2. A surface treatment method of batch type for transporting an object to be treated along a treatment bath train including a predetermined number of treatment baths and for dipping said object in a treatment liquid supplied in said treatment baths in a predetermined order, thereby to execute a surface treatment of said object, said surface treatment method comprising the steps of:

preparing a treatment bath train comprising a plurality of treatment baths in which a selected treatment bath is constructed of three or more unit treatment vessels each of which contains the same treatment liquid, and one among said unit treatment vessels is cyclically selected for replacing the treatment liquid thereof every time when predetermined conditions are satisfied;

dipping said object successively in the treatment liquid in a unit treatment vessel of said selected treatment bath in which the treatment liquid has been replaced earliest among all other unit treatment vessels of said selected treatment bath not being subjected at that moment to the replacement of the treatment liquid, a dipping time period in each unit treatment vessel of said selected treatment bath being determined according to a characteristic of the treatment liquid therein; and replacing the treatment liquid in said selected treatment bath successively one by one of said unit treatment vessels.

3. A surface treatment method in accordance with claim 1, wherein said object is dipped successively from the treatment liquid in the unit treatment vessel in which the treatment liquid has been replaced earliest among all unit treatment vessels not subjected at that moment to the replacement of the treatment liquid.

4. A surface treatment method of batch type for transporting an object to be treated along a treatment bath train including a predetermined number of multi-vessel treatment baths and for dipping said object in a treatment liquid supplied in said multi-vessel treatment baths in a predetermined order, thereby to execute a surface treatment of said object, said surface treatment method comprising the steps of:

preparing a treatment bath train comprising a plurality of multi-vessel treatment baths in which each of said multi-vessel treatment baths is constructed to have a number of unit treatment vessels corresponding to the time required for the dip of said object therein, a dipping time in each unit treatment vessel being identical for each of said multi-vessel treatment baths;

replacing the treatment liquid in each of said multi-vessel treatment baths successively one by one of said unit treatment vessels thereof; and transporting said object along said multi-vessel treatment baths to dip said object in the treatment liquid in a unit treatment vessel thereof which is not being subjected to the replacement of the treatment liquid at that moment while one of said unit treatment vessels is being subject to replacement.

5. A surface treatment method of batch type for transporting an object to be treated along a treatment bath train including a predetermined number of treatment baths and for dipping said object in a treatment liquid supplied in said treatment baths in a predetermined order, thereby to execute a surface treatment of said object, said surface treatment method comprising the steps of:

preparing a treatment bath train comprising a multi-group of unit treatment vessels formed of combining two or more groups of unit treatment vessels, said multi-group of unit treatment vessels being constructed as a pair of groups of unit treatment vessels and the treatment liquid being replaced alternatively for said pair of groups of unit treatment vessels every time when predetermined conditions are satisfied while said object is dipped in the treatment liquid in the group of unit treatment vessels not being subjected at that moment to the replacement of the treatment liquid therein;

replacing the treatment liquid in said multi-group of unit treatment vessels successively one by one of said groups of unit treatment vessels; and transporting said object along said treatment bath train to dip said object in the treatment liquid in the group of unit treatment vessels which is not being subjected to replacement of the treatment liquid contained therein while one of said groups of unit vessel treatment vessels is being subject to replacement at that moment.

6. A surface treatment method of batch type for transporting an object to be treated along a treatment bath train including a predetermined number of treatment baths and for dipping said object in a treatment liquid supplied in said treatment baths in a predetermined order, thereby to execute a surface treatment of said object, said surface treatment method comprising the steps of:

preparing a treatment bath train comprising a multi-group of unit treatment vessels obtained by combining two or more groups of unit treatment vessels, said multi-group of unit treatment vessels being constructed to have three or more groups of unit treatment vessels and one group thereof being cyclically selected for replacing the treatment liquid every time when predetermined conditions are satisfied while the remaining groups of unit treatment vessels are used for dipping the object;

replacing the treatment liquid in said multi-group of unit treatment vessels successively one by one of said groups of unit treatment vessels; and transporting said object along said treatment bath to dip said object successively into the treatment liquid in each unit treatment vessel belonging to the group of unit treatment vessels in which the treatment liquid has been replaced earliest among all of said groups of unit treatment vessels not being subjected at that moment to the replacement of the treatment liquid.

7. A surface treatment method of batch type for transporting an object to be treated along a treatment bath train including a predetermined number of treatment baths and for dipping said object in a treatment liquid supplied in said treatment baths in a predetermined order, thereby to execute a surface treatment of said object, said surface treatment method comprising the steps of:

preparing a treatment bath train comprising a multi-group of unit treatment vessels obtained by combining two or more groups of unit treatment vessels, said multi-group of unit treatment vessels being constructed to have three or more groups of unit treatment vessels and one group thereof being cyclically selected for replacing of the treatment liquid contained therein every time that predetermined conditions are satisfied while the remaining groups of unit treatment vessels are used for dipping the object;

replacing the treatment liquid in said groups of unit treatment vessels successively one by one of said groups of unit treatment vessels; and transporting said object along said treatment bath to dip said object successively into the treatment liquid in each unit treatment vessel belonging to the group of unit treatment vessels in which the treatment liquid has been replaced earliest among all of said groups of unit treatment vessels not being subjected at that moment to the replacement of the treatment liquid while one of said groups of unit treatment vessels is being subject to replacement.

8. A surface treatment method in accordance with claim 2, wherein:

the number of said unit treatment vessels in said desired treatment bath is determined in correspondence to the time required for dipping of the object therein, a dipping time in each unit treatment vessel being identical for each multi-vessel treatment bath.

* * * * *